US007935265B2

(12) United States Patent
Schwanke et al.

(10) Patent No.: US 7,935,265 B2
(45) Date of Patent: *May 3, 2011

(54) CERAMIC SUBSTRATE MATERIAL, METHOD FOR THE PRODUCTION AND USE THEREOF, AND ANTENNA OR ANTENNA ARRAY

(75) Inventors: Dieter Schwanke, Hof (DE); Achim Bittner, Burgkundstadt (DE); Ulrich Schmid, Saarbruecken (DE); Mirco Harnack, Berg (DE)

(73) Assignee: Biotronik CRM Patent AG, Baar (CH)

( * ) Notice: Subject to any disclaimer, the term of this patent is extended or adjusted under 35 U.S.C. 154(b) by 470 days.

This patent is subject to a terminal disclaimer.

(21) Appl. No.: 12/045,149

(22) Filed: Mar. 10, 2008

(65) Prior Publication Data

US 2008/0286554 A1    Nov. 20, 2008

(30) Foreign Application Priority Data

May 4, 2007    (DE) .......................... 10 2007 020 888

(51) Int. Cl.
*B32B 5/18*    (2006.01)
*C23F 1/00*    (2006.01)
(52) U.S. Cl. ................ 216/56; 216/41; 216/95; 216/97; 216/101; 216/102; 216/103; 428/312.6
(58) Field of Classification Search .......................... None
See application file for complete search history.

(56) References Cited

U.S. PATENT DOCUMENTS

| 4,867,935 | A | | 9/1989 | Morrison, Jr. |
| 5,089,071 | A | | 2/1992 | Tominaga et al. |
| 5,100,714 | A | * | 3/1992 | Zsamboky ............... 428/137 |
| 5,108,958 | A | | 4/1992 | Moh et al. |
| 5,674,301 | A | | 10/1997 | Sakai et al. |
| 5,859,614 | A | | 1/1999 | Paolella et al. |
| 5,993,750 | A | | 11/1999 | Ghosh et al. |
| 6,540,975 | B2 | | 4/2003 | Tonkovich et al. |
| 6,616,909 | B1 | | 9/2003 | Tonkovich et al. |

(Continued)

FOREIGN PATENT DOCUMENTS

DE    33 32 029 A1    3/1984

(Continued)

OTHER PUBLICATIONS

European Search Report for Application No. 08 07 5261, dated Feb. 11, 2010, 5 pages.

(Continued)

*Primary Examiner* — Ling Xu
(74) *Attorney, Agent, or Firm* — ARC IP Law, PC; Joseph J. Mayo

(57) ABSTRACT

A method for producing a ceramic substrate material having a first layer and possibly a further layer is specified. The first layer comprises at least one first component made of a crystalline ceramic material and/or a glass material as a matrix and a second component made of a further crystalline ceramic material, which is provided in the matrix. An etching step is performed, mantle areas of the crystals and/or crystal agglomerates of the second component being etched selectively in the first layer to generate a cavity structure in the first layer. The present invention also relates to a corresponding ceramic substrate material, an antenna or an antenna array, and the use of the ceramic substrate material for an antenna or an antenna array.

27 Claims, 2 Drawing Sheets

U.S. PATENT DOCUMENTS

| | | |
|---|---|---|
| 6,936,237 B2 | 8/2005 | Wang et al. |
| 7,288,231 B2 | 10/2007 | Tonkovich et al. |
| 2007/0034910 A1 | 2/2007 | Shie |
| 2008/0286554 A1 | 11/2008 | Schwanke et al. |
| 2009/0098030 A1 | 4/2009 | Schwanke et al. |
| 2010/0255261 A1 | 10/2010 | Schwanke et al. |

FOREIGN PATENT DOCUMENTS

| | | |
|---|---|---|
| DE | 4234349 | 4/1993 |
| DE | 10042653 | 8/2000 |
| DE | 10043194 | 9/2000 |
| DE | 100 35 623 | 2/2002 |
| DE | 10042653 | 2/2002 |
| DE | 10043194 | 3/2002 |
| DE | 103 13 685 A1 | 10/2003 |
| DE | 10245848 | 4/2004 |
| DE | 10 2005 004 075 A1 | 8/2006 |
| DE | 10 2007 020 888 A1 | 11/2008 |
| EP | 0188 065 | 7/1986 |
| EP | 0234896 | 2/1987 |
| EP | 0234896 | 9/1987 |
| EP | 08 70 541 A2 | 10/1998 |
| EP | 1 314 472 A1 | 5/2003 |
| EP | 1 990 331 A | 11/2008 |
| EP | 2 055 374 A | 5/2009 |
| GB | 2266181 | 3/1993 |
| GB | 2266181 | 10/1993 |
| WO | 00/06295 A1 | 2/2000 |
| WO | 01/12312 A2 | 2/2001 |
| WO | 02/09232 A1 | 1/2002 |

OTHER PUBLICATIONS

German Search Report, dated Nov. 30, 2007.
Bittner A., Schmid U.: "The porosification of fired LTCC substrates by applying a wet chemical procedure," *Journal of the European Ceramic Society*, Bd. 29, Jul. 7, 2008, pp. 99-104, XP002565823.
German Search Report for related application, dated Apr. 16, 2008.
German Search Report for related application, dated Feb. 18, 2009.
European Search Report for related application, dated Feb. 16, 2010.

\* cited by examiner

CERAMIC SUBSTRATE MATERIAL, METHOD FOR THE PRODUCTION AND USE THEREOF, AND ANTENNA OR ANTENNA ARRAY

This application takes priority from German Patent Application DE 10 2007 020 888.1, filed 4 May 2007, the specification of which is hereby incorporated herein by reference.

BACKGROUND OF THE INVENTION

1. Field of the Invention

The invention relates to a method for producing a ceramic substrate material having a first layer and possibly a further layer, the first layer comprising at least one first component made of a crystalline ceramic material and/or a glass material as a matrix and a second component made of a crystalline ceramic material which is present in the matrix. Furthermore, the invention relates to a ceramic substrate material having a first layer and possibly a further layer, the first layer comprising a least one first component made of a crystalline ceramic material and/or a glass material as a matrix. In addition, the present invention relates to the use of a ceramic substrate material of this type and an antenna or an antenna array.

2. Description of the Related Art

Single or multilayered ceramic substrate materials form important starting materials for microelectronic components, in particular for telecommunication. A layer represents a ply or a film of the substrate material having a large extension in two spatial directions and a comparatively small extension in the third spatial direction, running perpendicular to the first two spatial directions. A sintered layer of an LTCC substrate typically has a thickness of 140 µm.

Both materials having low dielectric constants and also materials having moderately higher dielectric constants ($\in_r$) and/or relative permittivity (also referred to as the dielectric index or permittivity index) are manufactured from glass ceramic materials. A ceramic material which initially represents a glass composition, and which sinters upon subsequent annealing at temperatures up to 1000° C. before the crystallization to form a dense compound, so that a partially or completely crystalline material results, is referred to as a glass ceramic.

An important and cost-effective technology for producing microelectronic substrates having a high occupation density is the so-called "Low Temperature Cofired Ceramics" technology, referred to in the following as LTCC technology. LTCC technology is a technology for producing multilayered circuits on the basis of sintered ceramic carriers. Printed conductors, capacitors, resistors, and coils may be generated on the substrates. These elements are applied to the particular unfired layer by screenprinting or photochemical processes. The unfired ceramic films are individually structured and subsequently stacked and laminated. A defined sintering profile having a peak temperature of approximately 850° C. to 900° C. is then applied to harden the structure.

Single or multilayered substrates for electronic configurations are frequently provided with materials which have a low dielectric constant if a high speed of the electronic signals through the substrate is to be achieved at high frequencies. With a low dielectric constant or permittivity, the largest possible part of the HF signal, of an antenna, for example, is emitted and little energy is coupled into the material and thus consumed wastefully.

A glass ceramic compound having at least one oxide ceramic, which has barium, titanium, and at least one rare earth metal, and a least one glass material, which contains at least one oxide having boron, is described in the publication DE 100 43 194 A1. In addition, the glass material has an oxide having at least one tetravalent metal and an oxide having at least one rare earth metal. This glass ceramic compound hardens at a temperature of less than 850° C. and is suitable for use in microwave technology. In particular through the oxide of the rare earth metal it is possible to tailor the dielectric material properties of the glass material to the dielectric material properties of the oxide ceramic. The higher the proportion of lanthanum trioxide in the glass material, the higher the permittivity of the glass material. In addition, the composition of the oxide ceramic and of the glass material is selected in such a manner that crystallization products are formed during the hardening (for example, by reactive liquid phase sintering) and particularly after the hardening (at higher temperatures). These crystallization products subsequently influence the dielectric material properties of the glass ceramic compound, so that the glass ceramic compound may be used in microwave technology. In this way, for example, at low hardening temperature, a glass ceramic compound and having relatively higher permittivity of greater than 15 and having a quality of 350 may be obtained. The material described in DE 100 43 194 A1 is not suitable for applications at high frequencies, however.

A composite ceramic having low dielectric constants is known from the publication DE 42 34 349 C2, in which multiple mullite bubbles are dispersed, which are selected from the group comprising a glass matrix based on borosilicate and a glass ceramic matrix based on aluminum silicate. These mullite bubbles are typically produced by heating aluminum borosilicate bubbles. The mullite bubbles typically have a diameter of up to approximately 50 µm. However, the production of these materials is very complex. Furthermore, a non-planar surface characteristic is to be expected, which particularly precludes the use in this field of thin-film technology having structural dimensions in the micrometer scale.

A ceramic material composition for electronic applications is described in the publication U.S. Pat. No. 5,108,958, which has hollow, thin-walled, fireproof ceramic bubbles, which are distributed uniformly in a fireproof ceramic matrix. The ceramic bubbles comprise a material which has a dielectric constant of less than 9. The known material composition has a low dead electric constant, a low loss factor, and a thermal coefficient of expansion which may be adapted to that of the IC chip. The ceramic bubbles comprise aluminum borosilicate, mullite, or a mixture of both, for example. The diameter of the bubbles is between approximately 1 to 50 µm and they have a wall thickness of approximately 0.05 to approximately 0.5 µm. Aluminum oxide, aluminum phosphate, mullite, cordierite, fosterite, or stearite is used as the matrix material. The crystallites of the compounds are situated in the walls of the bubbles form a network structure having cavities in the walls of the bubbles. The size of these cavities is approximately 0.5 µm. The production and the handling of a material composition of this type is also complex. In addition, the level of the dielectric constant is influenced by whether the ceramic bubbles fracture or are destroyed in another way during the production of a component.

A material having a low dielectric constant is disclosed in EP 0 234 896 A2, which is suitable for circuits of thick-film technology such as VLSI elements. It is disclosed in the publication that the dielectric constant of an insulating material having a layer made of hollow glass microbeads already results in a significant reduction of the dielectric constant due to the large air volume in the beads at a small proportion of the beads, i.e., above a proportion of 10 to 15 volume-% in the layer. Above a proportion of 45 to 50 volume-% of the glass microbeads in the layer, however, the structural strength and the thermal resistance of the resulting insulating layers are negatively influenced.

The embedding of hollow microbeads in a dielectric composition is also disclosed in the publication U.S. Pat. No. 4,867,935. These are hollow microbeads made of a ceramic which is embedded in a ceramic matrix. This publication also discloses the disadvantages of using hollow microbeads. They may fracture during the production method, so that the desired reduction of the dielectric constant is not achieved. This problem is remedied in the publication U.S. Pat. No. 4,867,935 in that the hollow ceramic microbeads are dispersed at high speeds in a ground mixture, so that a slurry having a viscosity in the range from approximately 500 to 1500 cps results. However, this is quite a complex production method.

In addition, the publication U.S. Pat. No. 4,867,935 discloses, as a further disadvantage of a layer having microbeads, that at too high a proportion (above 40%) of the microbeads, the air tightness of the resulting ceramic product worsens. In addition, the surface roughness of the layer may become problematic during the further processing of the layer. In contrast, at too low a proportion of the microbeads, the desired reduction of the dielectric constant may not be achieved.

A ceramic multilayer circuit made of at least two ceramic layers lying one on top of another, which differ in their dielectric constants, is known from the publication DE 100 42 653 A1. To produce a ceramic multilayer circuit of this type using the LTCC method, it is suggested that green ceramic films be positioned one on top of another for stacking and subsequent sintering in the stacked state, which have the same raw material as the other layers, but have a reduced crystallization temperature in comparison thereto. In this way, these layers crystallize early and thus freeze in a high porosity. The areas having a high porosity have a reduced dielectric constant. The lowered crystallization temperature may be achieved in that the ceramic raw material is ground comparatively finely before the casting and drying or crystallization seeds are added to the material. The method described has the disadvantage that the LTCC method must be altered and additional layers must be used, which have a different shrinkage behavior than the remaining layers under certain circumstances.

An integrated semiconductor circuit having an intermediate layer made of insulating material, which reduces the capacitance of the circuits and increases the operating speed, is described in the document GB 2 266 181 A. The insulating intermediate layer has a glass matrix which contains aluminum or tantalum particles. These may be etched away by an etching agent such as NaOH or KOH, so that a layer results in which cavities are situated uniformly distributed. The disadvantage of this method is that it is only suitable for very thin layers having a thickness of less than 1 µm. Thin layers of this type are used in semiconductor circuits, but they are not suitable for use for antennas. The etching of a thicker layer is not possible due to the lack of bonding of the particles to one another.

BRIEF SUMMARY OF THE INVENTION

It is therefore the object of the present invention to specify a simple and cost-effective, and also reliable method for producing a ceramic substrate material for thick-film applications in the range of layer thicknesses above multiple tens of micrometers, preferably at layer thicknesses from approximately 20 to approximately 30 µm, which generates a substrate material having a low dielectric constant. Furthermore, the object comprises providing a corresponding thick ceramic substrate material which allows the use of LTCC technology. In addition, the object comprises specifying a suitable use of a ceramic substrate material of this type. Moreover, the object comprises specifying an antenna or on antenna array having a thick substrate material which is producible simply and cost-effectively.

The specified object is achieved by a method for producing a ceramic substrate material in which an etching step is performed in such a manner that mantle areas of the crystals and/or crystal agglomerates of the second component are etched selectively to generate a cavity structure in the first layer. The cavity structure is preferably a pore or tube structure. The structure of the cavities is oriented to the structure and/or spatial shape in which the mantle areas of the second components are provided, which are preferably formed by one or more transition or intermediate phases. The transition and intermediate phases preferably have a slightly altered crystal structure in relation to the structure and/or composition of the crystalline second component, which may also be regionally amorphous, and/or a slightly altered composition. The mantle areas may also have components of the matrix in the composition. The composition and/or the structure of the mantle areas may vary over a specific range. The mantle area of a crystal or crystal agglomerate which is composed of multiple crystals thus comprises the grain boundary area of the particular crystal or crystal agglomerate, but may additionally extend into the crystal having the stoichiometric composition of the second component. The extension of the mantle area is also a function of the etching time and the etching agent used.

The specified method is a very simple and cost-effective and also well controllable method for generating a ceramic substrate material having a low dielectric constant. It also does not cause the disadvantages specified above upon the use of hollow microbeads and leaves the LTCC method unchanged. In addition, due to the selective etching of the mantle areas, layers having a greater thickness in the range of multiple tens of micrometers, preferably layer thicknesses between approximately 20 µm and approximately 30 µm may be etched, because the mantle areas of the crystals and/or crystal agglomerates bond the adjacent crystals and crystal agglomerates to one another, and the etching agent thus penetrates along the mantle areas into the layer during the etching.

The porosification procedure, i.e., the etching step in which the cavity structure is generated in the matrix of the layer body, allows a dielectric constant to be generated which is between air (approximately 1) and the remaining glass ceramic or crystalline ceramic. The dielectric constant $\in_r$ resulting in the porosified areas, which is composed of the dielectric constant of the material of the etched layer remaining after the etching procedure and the dielectric constant of the cavity structure, of up to 2 may be achieved.

DETAILED DESCRIPTION OF THE INVENTION

Figure 1:
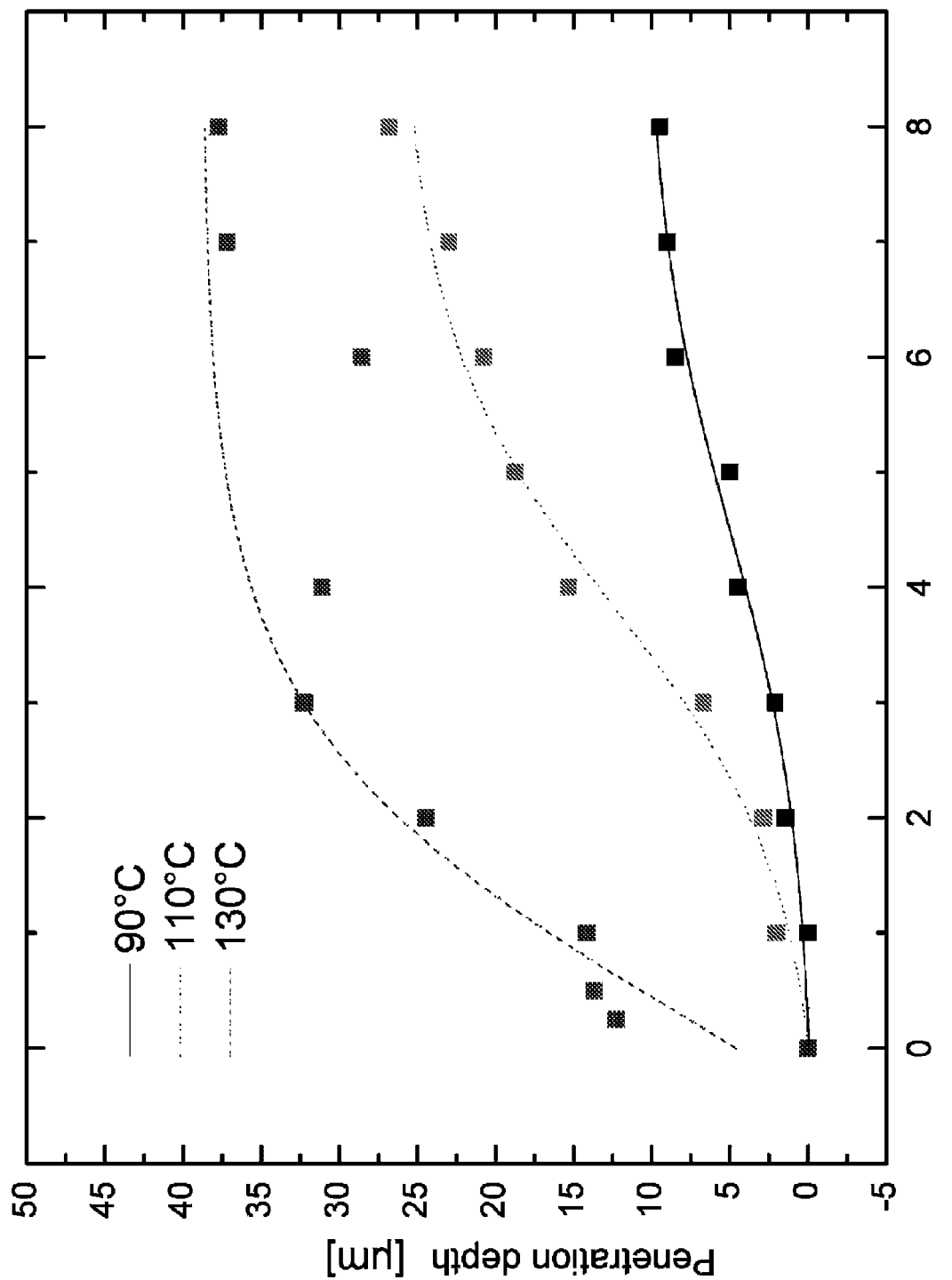
FIG. 1 shows etching time versus penetration depth for an exemplary embodiment of the invention.

The present invention uses the finding that one material, i.e., the material having a higher dielectric constant, may be etched out in multiphase materials having not only two materials completely different structurally and in their composition, but rather having materials which are more similar to one another in their composition and structure (second component on one hand and the mantle areas of the crystals and crystal agglomerates of the second component on the other hand), which differ in their etching behavior. Air having a dielectric constant of approximately 1 exists in the etched-out areas after the etching step. The two materials have to be able to be selectively etched for this purpose.

In a preferred exemplary embodiment, the etching step is performed in a predetermined area of the first layer and/or up to a predetermined depth of the first layer, preferably using a corresponding mask, to only generate a cavity structure in the first layer in the predetermined area and/or up to the predetermined depth. In this manner, a locally reduced dielectric constant is provided, namely in the area of the opening of the etching mask up to a predefined depth of the first layer, and/or a locally reduced loss factor or a local reduction of the thermal conductivity is provided. Furthermore, defined mechanical intended breakpoints may be introduced. The etching depth is primarily controlled by the processing parameters of temperature, concentration of the etching medium, and the time of the action of the etching medium. For example, during a processing time of 6 hours, a depth of the cavity structure in the first layer of 20 µm may be achieved by an etching agent based on phosphoric acid.

In a further preferred exemplary embodiment, the matrix and the second component form a glass ceramic material before the etching step. This material may be controlled well in regard to the required crystal size and distribution of the second component and of the mantle area of the crystals and crystal agglomerates in the first layer and thus the later structure of the etched cavity structure. The glass ceramic material may be processed very easily using LTCC technology. In addition, the corresponding tapes are commercially available.

In a further exemplary embodiment, the second component contains $Al_2O_3$ crystallites and/or an aluminum-based crystalline compound different from $Al_2O_3$ and/or a crystalline compound based on aluminum oxide as well as surrounding mantle areas which contain crystals and/or crystal agglomerates of the second component as the boundary transition layer, i.e., inter alia, comprise $Al_2O_3$ crystallites and/or an aluminum-based crystalline compound different from $Al_2O_3$ and/or a crystalline compound based on aluminum oxide. The mantle areas of the specified parts of the second component and/or the specified mantle areas may be etched especially easily using the preferred wet-chemical etching method, preferably using an etching agent based on phosphoric acid. The etching agent based on phosphoric acid is also used for other etching steps in which other structures are produced, so that the handling of this etching agent in production is known.

In an especially preferred exemplary embodiment, the substrate material has at least two layers, the at least two layers first being produced as LTCC using LTCC technology and subsequently a cavity structure being generated in the first layer. The production of the two LTCC layers includes, as already described, at least one sintering step, so that the porosification occurs in the sintered first layer. In this exemplary embodiment, it is advantageous that the substrate may initially be produced using the typical process control in ceramic multilayer technology having internal components and vias, which are not impaired by the etching procedures. The range of the dielectric constants between 3 and 4, which was implemented until now using organic HF materials, is thus also opened up to ceramics which are produced using LTCC technology.

Furthermore, it is possible using typical methods of thin-film and thick-film technology to apply functional layers to the porosified material and without interruption over the transition between porosified and non-porosified material.

The above object is additionally achieved by a ceramic substrate material in which the first layer contains a second component made of a further crystalline ceramic material, the mantle areas of the crystals and/or crystal agglomerates of the second component being at least regionally etched out in such a manner that a cavity structure is provided. This ceramic substrate material is simple and cost-effective to produce. In addition, the substrate material regionally has the desired low resulting dielectric constant of up to 2, the layer thickness of the first layer preferably being multiple tens of micrometers.

The cavity structure which is a pore or tube structure is especially preferred. It may be produced easily.

The second component preferably contains $Al_2O_3$ crystallites and/or an aluminum-based crystalline compound different from $Al_2O_3$ and/or a crystalline compound based on aluminum oxide, preferably having a total proportion of at most 40 volume-% of the first layer, and in the mantle areas. Through this proportion of the second component and/or the corresponding proportion of the mantle areas of the crystals and/or crystal agglomerates of the second component, a sufficient strength of the ceramic substrate material after the etching and simultaneously a low dielectric constant are achieved in the etched areas of the first layer. The compounds based on aluminum and aluminum oxide, which the mantle areas of the second component contain, may additionally be etched easily using an etching agent based on phosphoric acid.

The etched cavity structure is especially preferably only provided in a predetermined area of the first layer and extends up to a predetermined depth of the first layer. This results in an advantageous local reduction of the dielectric constant, the loss factor, and/or a local reduction of the thermal conductivity.

In the etched areas, the resulting dielectric constant $\in_r$ is preferably between approximately 10 and 1, especially preferably between approximately 5 and 1. The local reduction of $\in_r$ is advantageous, because for a radar sensor, in particular in the range of 80 GHz, the distribution network is to have a high dielectric constant to minimize radiation effects.

The ceramic substrate material especially preferably has at least two layers which are produced using LTCC technology. The LTCC technology further simplifies the production of the ceramic substrate material. The method is additionally cost-effective.

The employment according to the invention of a ceramic substrate material specified above comprises the use for an antenna or an antenna array, in particular for high frequencies in the range of 80 GHz.

According to the invention, the object is also achieved by an antenna or an antenna array having a substrate material according to the invention specified above.

In the normal antennas or antenna arrays, a Rogers tape is typically stuck in an LTCC cavity and the metal plating of the two areas lying above is connected using wire bonding. In a preferred exemplary embodiment, in contrast, an antenna according to the invention or an antenna array according to the invention has an etched cavity structure regionally in each of its elements in the first layer and the metal plating lying above extends from the area having the etched cavity structure up into an area in which no etched cavity structure is provided. The metal plating may be implemented here as a thick-film or thin-film metal plating. The advantage of an antenna or an antenna array of this type is that a wire bonding connection is no longer necessary between the areas of the metal plating and in this way the reliability of the overall construction is increased, because a combination of materials is dispensed with and the number of the bonded glued joints is reduced. In addition, the assembling and packaging are simplified, because no bonding step is necessary.

Further goals, features, advantages, and possible applications of the invention result from the following description of an exemplary embodiment on the basis of a diagram specified in FIG. 1. Furthermore, the construction of an antenna according to the invention is shown on the basis of a schematic sectional illustration in FIG. 2. All features described and/or shown in the figures form the subject matter of the present invention alone or in any arbitrary combination, independently of their summary in the individual claims or what they refer back to.

EXAMPLES

A substrate material having a first layer made of sintered glass ceramic, e.g., an LTCC tape having the composition 30% $SiO_2$, 40% $Al_2O_3$, 4% CaO, 9% PbO, 2% $B_2O_3$+remainder—known under the product identification DP951, the composition 30% $SiO_2$, 20% $Al_2O_3$, 3% CaO, 5% SrO, 17% BaO, 5% ZnO+remainder—known as "Heraeus Tape"—or the composition approximately 50% $Al_2O_3$, approximately 15% $B_2O_3$, approximately 15% $La_2O_3$, +remainder, which is known under the product identification DP943 of Hereaus, is laid in a suitable etching solution (e.g., phosphoric acid for DP951, "Heraeus Tape", and DP943) at a temperature of 110° C. for the porosification. The porosification procedure may alternatively also be performed using KOH (potassium hydroxide solution) of a concentration of approximately 40% at a temperature in the range of 80° C.

The curve illustrated in the diagram of FIG. 1 shows the dependence of the penetration depth of the etching solution phosphoric acid into the volume of the glass ceramic DP951, which has a composition of 30% $SiO_2$, 40% $Al_2O_3$, 4% CaO, 9% PbO, 2% $B_2O_3$+remainder, at an etching temperature of 110° C. or 90° C., and thus the depth of the cavity structure generated in the first layer in μm on the Y axis on the etching time in hours plotted on the X axis, because the penetration depth may be controlled by the etching time. For example, at an etching temperature of 110° C., a penetration depth of 15 μm is achieved during an etching time of four hours.

Figure 2:
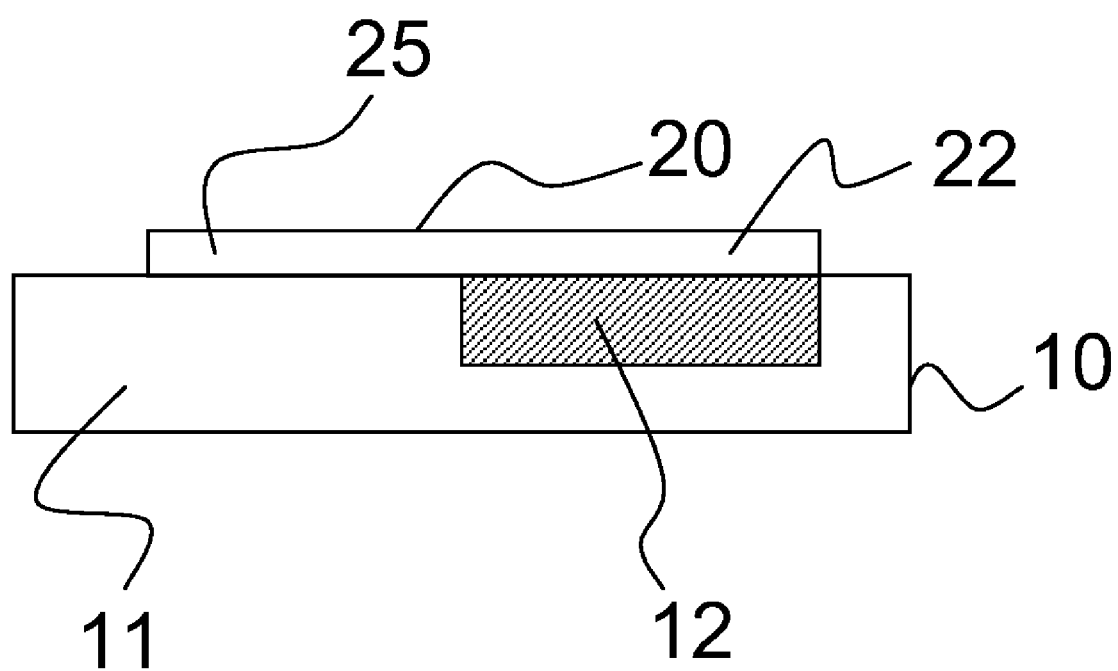
FIG. 2 shows a sectional illustration of an exemplary embodiment of an antenna constructed according to the invention.

The construction of an antenna according to the invention is shown in section in FIG. 2. A porosified area 12 having the etched cavity structure, which has a low dielectric constant, is provided in a first layer 10. The porosified area 12 passes seamlessly into the remaining, non-porosified areas 11 of the first layer 10. A metallic layer (metal plating) 20 is positioned on the surface, which is implemented above the porosified area 12 as the antenna structure 22. The metallic layer is implemented as a printed conductor 25 above the remaining areas 11 of the first layer 10. The metal plating having the antenna structure 22 and the printed conductor 25 may be applied simultaneously in one metal plating step without additional bonding connection.

What is claimed is:

1. A method for producing a ceramic substrate material having at least one layer comprising a first layer, the first layer comprising at least one first component made of either a crystalline ceramic material or a glass material or both, as a matrix and a second component made of a further crystalline ceramic material wherein the further crystalline ceramic material comprising crystals, or crystal agglomerates or both, which is provided in the matrix, comprising:

etching in such a manner that mantle areas of either crystals or crystal agglomerates or both, of the second component are etched selectively in the first layer wherein said etching is performed
in a predetermined area of the first layer or up to a predetermined depth of the first layer
or
in the predetermined area of the first layer and up to the predetermined depth of the first layer, using a corresponding mask; and,
generating a cavity structure in the first layer only
in the predetermined area or up to the predetermined depth of the first layer
or
in the predetermined area and up to the predetermined depth of the first layer.

2. The method according to claim 1, further comprising:
etching a transition or intermediate phase of the second component in the mantle areas of the crystals or the crystal agglomerates or both, of the second component.

3. The method according to claim 1, wherein said generating the cavity structure comprises generating a pore or tube structure.

4. The method according to claim 1, wherein the matrix and the second component form a glass ceramic material before said etching.

5. The method according to claim 1, wherein the second component contains $Al_2O_3$ crystallites or an aluminum-based crystalline compound different from $Al_2O_3$ or a crystalline compound based on aluminum oxide or any combination thereof, and the mantle areas contain
the crystals or the crystal agglomerates
or
the crystals and the crystal agglomerates
of the second component.

6. The method according to claim 1, wherein said etching includes wet-chemical etching using an etching agent based on phosphoric acid.

7. The method according to claim 1, wherein the ceramic substrate material has at least two layers, and the least two layers are first produced as LTCC or Low Temperature Cofired Ceramics and subsequently a cavity structure is generated in the first layer.

8. The method according to claim 1 comprising:
constructing an antenna or an antenna array using said ceramic substrate material.

9. A method for producing a ceramic substrate material having at least one layer comprising a first layer, the first layer comprising at least one first component made of either a crystalline ceramic material or a glass material or both, as a matrix and a second component made of a further crystalline ceramic material wherein the further crystalline ceramic material comprising crystals, or crystal agglomerates or both, which is provided in the matrix, comprising:
etching in such a manner that mantle areas of either crystals or crystal agglomerates or both, of the second component are etched selectively in the first layer; and,
generating a cavity structure in the first layer wherein the ceramic substrate material has at least two layers, and the least two layers are first produced as LTCC or Low Temperature Cofired Ceramics and subsequently, said cavity structure is generated in the first layer.

10. The method according to claim 9, further comprising:
etching a transition or intermediate phase of the second component in the mantle areas of the crystals or the crystal agglomerates or both, of the second component.

11. The method according to claim 9, wherein said generating the cavity structure comprises generating a pore or tube structure.

12. The method according to claim 9, wherein the matrix and the second component form a glass ceramic material before said etching.

13. The method according to claim 9, wherein the second component contains $Al_2O_3$ crystallites or an aluminum-based crystalline compound different from $Al_2O_3$ or a crystalline compound based on aluminum oxide or any combination thereof, and the mantle areas contain
  the crystals or the crystal agglomerates
  or
  the crystals and the crystal agglomerates
of the second component.

14. The method according to claim 9, wherein said etching includes wet-chemical etching using an etching agent based on phosphoric acid.

15. The method according to claim 9 comprising:
  constructing an antenna or an antenna array using said ceramic substrate material.

16. A method for producing a ceramic substrate material having at least one layer comprising a first layer, the first layer comprising at least one first component made of either a crystalline ceramic material or a glass material or both, as a matrix and a second component made of a further crystalline ceramic material wherein the further crystalline ceramic material comprising crystals, or crystal agglomerates or both, which is provided in the matrix, comprising:
  etching in such a manner that mantle areas of either crystals or crystal agglomerates or both, of the second component are etched selectively in the first layer;
  generating a cavity structure in the first layer; and,
  constructing an antenna or an antenna array using said ceramic substrate material.

17. The method according to claim 16, further comprising:
  etching a transition or intermediate phase of the second component in the mantle areas of the crystals or the crystal agglomerates or both, of the second component.

18. The method according to claim 16, wherein said generating the cavity structure comprises generating a pore or tube structure.

19. The method according to claim 16, wherein the matrix and the second component form a glass ceramic material before said etching.

20. The method according to claim 16, wherein the second component contains $Al_2O_3$ crystallites or an aluminum-based crystalline compound different from $Al_2O_3$ or a crystalline compound based on aluminum oxide or any combination thereof, and the mantle areas contain
  the crystals or the crystal agglomerates
  or
  the crystals and the crystal agglomerates
of the second component.

21. The method according to claim 16, wherein said etching includes wet-chemical etching using an etching agent based on phosphoric acid.

22. A method for producing a ceramic substrate material having at least one layer comprising a first layer, the first layer comprising at least one first component made of either a crystalline ceramic material or a glass material or both, as a matrix and a second component made of a further crystalline ceramic material wherein the further crystalline ceramic material comprising crystals, or crystal agglomerates or both, which is provided in the matrix, comprising:
  etching in such a manner that mantle areas of either crystals or crystal agglomerates or both, of the second component are etched selectively in the first layer wherein said etching is performed
    in a predetermined area of the first layer or up to a predetermined depth of the first layer
    or
    in the predetermined area of the first layer and up to the predetermined depth of the first layer, using a corresponding mask; and,
  generating a cavity structure in the first layer only
    in the predetermined area or up to the predetermined depth of the first layer
    or
    in the predetermined area and up to the predetermined depth of the first layer wherein the ceramic substrate material has at least two layers, and the least two layers are first produced as LTCC or Low Temperature Cofired Ceramics and subsequently, said cavity structure is generated in the first layer; and,
  constructing an antenna or an antenna array using said ceramic substrate material.

23. The method according to claim 22, further comprising:
  etching a transition or intermediate phase of the second component in the mantle areas of the crystals or the crystal agglomerates or both, of the second component.

24. The method according to claim 22, wherein said generating the cavity structure comprises generating a pore or tube structure.

25. The method according to claim 22, wherein the matrix and the second component form a glass ceramic material before said etching.

26. The method according to claim 22, wherein the second component contains $Al_2O_3$ crystallites or an aluminum-based crystalline compound different from $Al_2O_3$ or a crystalline compound based on aluminum oxide or any combination thereof, and the mantle areas contain
  the crystals or the crystal agglomerates
  or
  the crystals and the crystal agglomerates
of the second component.

27. The method according to claim 22, wherein said etching includes wet-chemical etching using an etching agent based on phosphoric acid.

* * * * *

UNITED STATES PATENT AND TRADEMARK OFFICE
CERTIFICATE OF CORRECTION

| | | |
|---|---|---|
| PATENT NO. | : 7,935,265 B2 | Page 1 of 1 |
| APPLICATION NO. | : 12/045149 | |
| DATED | : May 3, 2011 | |
| INVENTOR(S) | : Schwanke et al. | |

It is certified that error appears in the above-identified patent and that said Letters Patent is hereby corrected as shown below:

Title Page, item [75] Assignee: should read --

MICRO SYSTEMS ENGINEERING GMBH of BERG, GERMANY

Signed and Sealed this
First Day of November, 2011

David J. Kappos
*Director of the United States Patent and Trademark Office*